US012695467B2

(12) United States Patent
Jiao

(10) Patent No.: US 12,695,467 B2
(45) Date of Patent: Jul. 28, 2026

(54) ACTIVE-TYPE MULTI-LEVEL WIRELESS NETWORKING TRANSMISSION SYSTEM UNDER HIGH AND LOW FREQUENCY STRESSES FOR OCEAN ENGINEERING STRUCTURE

(71) Applicant: Zhejiang University, Hangzhou (CN)

(72) Inventor: Pengcheng Jiao, Hangzhou (CN)

(73) Assignee: Zhejiang University, Hangzhou (CN)

( * ) Notice: Subject to any disclaimer, the term of this patent is extended or adjusted under 35 U.S.C. 154(b) by 174 days.

(21) Appl. No.: 18/890,019

(22) Filed: Sep. 19, 2024

(65) Prior Publication Data

US 2025/0373269 A1 Dec. 4, 2025

(30) Foreign Application Priority Data

Jun. 3, 2024 (CN) .......................... 202410708692.9

(51) Int. Cl.
*H03M 13/19* (2006.01)
*H04L 1/00* (2006.01)

(52) U.S. Cl.
CPC .......... *H03M 13/19* (2013.01); *H04L 1/0006* (2013.01); *H04L 1/0011* (2013.01)

(58) Field of Classification Search
CPC .... H03M 13/19; H04L 1/0006; H04L 1/0011; H04L 67/12; H04L 69/14; H04W 4/38; H04W 84/18
See application file for complete search history.

(56) References Cited

U.S. PATENT DOCUMENTS

| | | | | |
|---|---|---|---|---|
| 5,592,791 A * | 1/1997 | D'Annunzio | ......... | E04H 9/0215 |
| | | | | 52/167.2 |
| 6,539,336 B1 * | 3/2003 | Vock | ......................... | A61B 5/11 |
| | | | | 702/182 |
| 7,986,076 B2 * | 7/2011 | Yoon | ...................... | H02N 2/186 |
| | | | | 310/329 |
| 9,455,649 B2 * | 9/2016 | Al Ahmad | ............. | H02N 2/188 |
| 2005/0273218 A1 * | 12/2005 | Breed | ................ | G06K 7/10178 |
| | | | | 701/2 |
| 2005/0285569 A1 * | 12/2005 | Rao | ........................... | H02J 7/34 |
| | | | | 320/128 |
| 2009/0140604 A1 * | 6/2009 | Chen | ................... | E21B 41/0085 |
| | | | | 310/311 |
| 2014/0232920 A1 * | 8/2014 | Kim | ...................... | H04N 23/611 |
| | | | | 348/333.02 |
| 2015/0134061 A1 * | 5/2015 | Friis | .................... | B29C 45/0001 |
| | | | | 264/439 |
| 2019/0018165 A1 * | 1/2019 | McManamon | .......... | G01V 1/44 |
| 2019/0324444 A1 * | 10/2019 | Cella | ................. | G05B 19/0425 |
| 2020/0045146 A1 * | 2/2020 | Ito | .......................... | H10F 77/211 |
| 2020/0386902 A1 * | 12/2020 | Xing | ........................ | G01V 1/04 |

* cited by examiner

*Primary Examiner* — Amine Benlagsir

(57) ABSTRACT

Disclosed is an active-type multi-level wireless networking transmission system under high and low frequency stresses for ocean engineering structures, including sensor units, a multi-channel data acquisition unit, a micro-control processor unit, a data wireless transmission unit, a server unit and a feedback monitoring unit. The multi-channel data acquisition unit, connected to multiple sensors, is configured to acquire sensor monitoring data; and the server unit is configured to receive the acquired monitoring data in real time, and realize data visualization analysis and early warning analysis. In the present disclosure, the deficiencies in realizing active-type multi-level wireless networking monitoring for the ocean structures can be overcome.

10 Claims, 1 Drawing Sheet

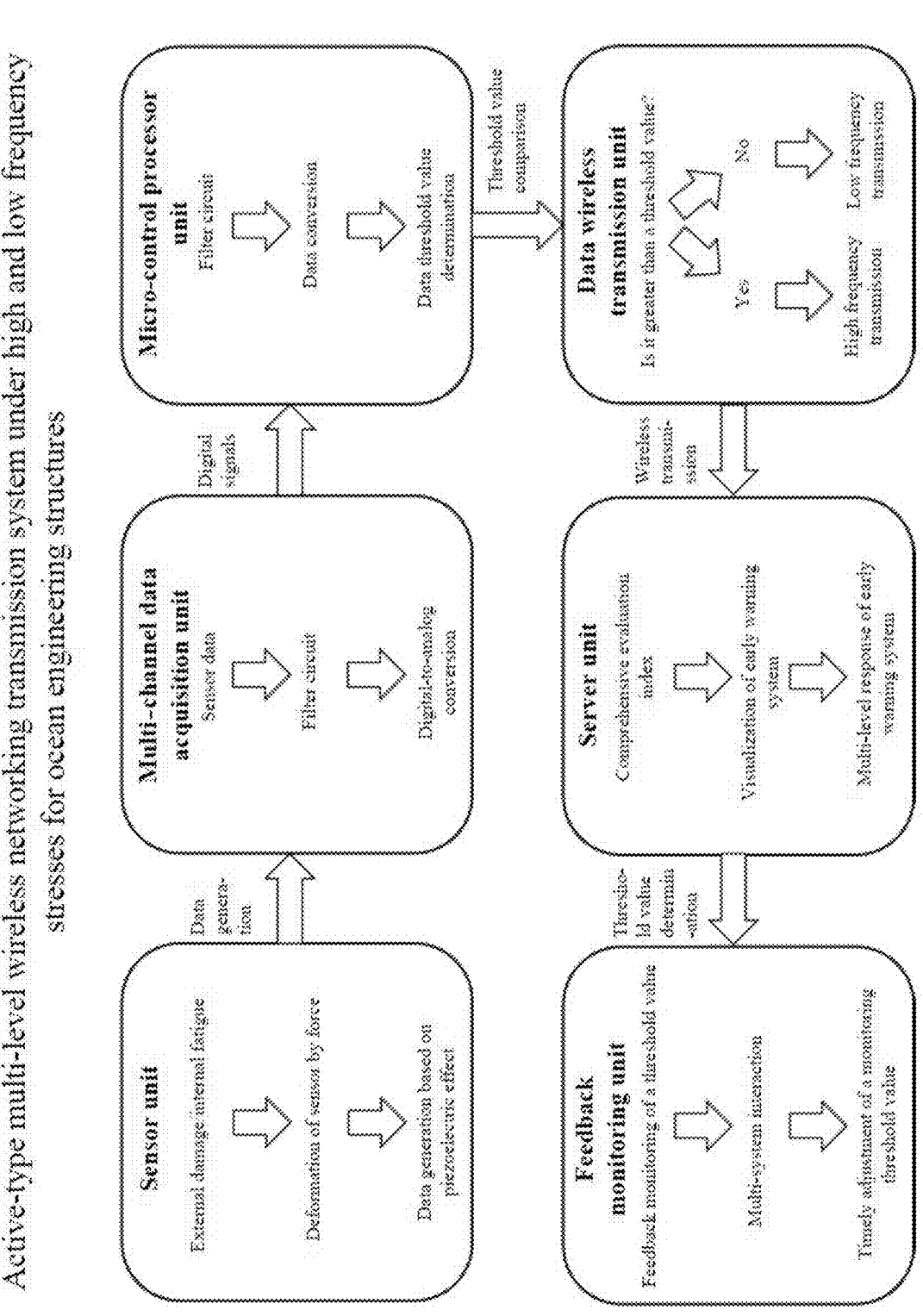
Active-type multi-level wireless networking transmission system under high and low frequency stresses for ocean engineering structures

ACTIVE-TYPE MULTI-LEVEL WIRELESS NETWORKING TRANSMISSION SYSTEM UNDER HIGH AND LOW FREQUENCY STRESSES FOR OCEAN ENGINEERING STRUCTURE

CROSS-REFERENCE TO RELATED APPLICATION

This application claims priority of Chinese Patent Application No. 202410708692.9, filed on Jun. 3, 2024, the entire contents of which are incorporated herein by reference.

TECHNICAL FIELD

The present disclosure belongs to the field of health monitoring of ocean engineering structures, and particularly relates to an active-type multi-level wireless networking transmission system under high and low frequency stresses for ocean engineering structures.

BACKGROUND

Large ocean engineering structures, such as offshore wind power, cross-sea bridges, ports and wharfs, are important infrastructure assets, which play an important role in promoting economic and social development and ensuring energy supply. However, the service conditions of ocean engineering environmental structures are poor, facing the risks and threats of extreme ocean environments in a daily operation process, such as structural degradation failure, ship/bridge collision and vehicle overload, which will seriously affect the life of key components and even endanger personal safety. Therefore, it is necessary to mount a structural health monitoring system on the ocean engineering structures to monitor environmental factors, external loads, structural responses and structural changes. However, the traditional monitoring system requires wired transmission and large power consumption, limiting the ability to realize low power consumption and long-distance transmission in the field. Therefore, the development of a multi-level wireless networking structure health monitoring system has become an important guarantee for the large-scale construction of ocean engineering structure and the realization of full life cycle monitoring.

The development of wireless sensing technology and integrated circuits provides technical support for the present disclosure. The wireless sensing technology includes data acquisition, wireless transmission, and data processing and early warning technology. Wireless transmission does not need wiring, so its arrangement is more flexible, greatly reducing the overall cost. As an emerging wireless transmission mode, the narrow-band Internet of things has great advantages in transmission power consumption, transmission bandwidth and transmission distance, and has become a research hotspot in the field of wireless transmission. A single chip microcomputer is an integrated circuit chip, which is a small and perfect computer system composed of integrating, by adopting ultra large scale integrated circuit technology, the functions of a central processing unit (CPU) with data processing capability, a random access memory (RAM), a read only memory (ROM), various input/output (I/O) ports, interrupt systems, and a timer/counter (possibly further including a display driving circuit, a pulse width modulation circuit, an analog multiplexer, and an analog-to-digital converter, etc.) into a silicon chip.

In the present disclosure, considering the deficiencies of a traditional sensing system in realizing active-type multi-level wireless networking monitoring for ocean structures, an active-type multi-level wireless networking transmission system under high and low frequency stresses for ocean engineering structures is provided, which can be used for real-time load data collection, signal processing and early warning of the ocean engineering structures. The innovation of the present disclosure is that the device integrates three systems of data acquisition, signal processing and early warning, realizing active sensing, adopting high and low frequency monitoring in an adaptive manner, reducing power consumption, greatly reducing junk data, and realizing monitoring feedback of multiple ocean engineering structure clusters.

SUMMARY

An object of the present disclosure is to address the deficiencies of the prior art and provide an active-type multi-level wireless networking transmission system under high and low frequency stresses for ocean engineering structures, to solve the problem that the traditional sensing system has deficiencies in realizing active-type multi-level wireless networking monitoring for ocean structures.

The object of the present disclosure is achieved by the following technical solutions: an active-type multi-level wireless networking transmission system under high and low frequency stresses for ocean engineering structures is specifically related. The system includes sensor units, a multi-channel data acquisition unit, a micro-control processor unit, a data wireless transmission unit, a server unit and a feedback monitoring unit.

The sensor unit is configured to monitor vibration responses of ocean engineering structures and convert mechanical vibrations into electrical signals for output;

the multi-channel data acquisition unit, connected to multiple sensor units, is configured to acquire an output signal of monitoring data of the sensor units, convert the output signal into a digital signal, and transmit the digital signal to the micro-control processor unit;

the micro-control processor unit is configured for preprocessing of the monitoring data and data storage, and is connected to the data wireless transmission unit via serial port communication;

the data wireless transmission unit is configured to send monitoring data pre-processed by the micro-control processor unit to the server unit in real time; the data wireless transmission unit contains a high and low frequency remote data wireless transmission module, adopting an encoding and decoding algorithm combining Hamming codes and parity check codes to transmit data, and setting a high and low frequency conversion threshold value; in a low frequency operation mode of 1 hz, the acquired data, when less than the threshold value, is transmitted to the server unit in a low frequency manner; and the acquired data, when greater than the threshold value, is transmitted to the server unit in a high frequency manner, triggering a frequency of 55 hz for data transmission;

the server unit is configured to receive the monitoring data in real time, perform data processing, storage, and visual analysis on monitoring results and perform early warning; and the feedback monitoring unit is configured to realize feedback monitoring and threshold value correction for multiple sensing systems.

Further, the sensor units are placed at key positions of the ocean engineering structures to monitor abnormal vibration response data of the structures; and when the structure vibrates, a sensor material is subject to force change to generate an electric charge distribution change based on a piezoelectric effect, generating an electric signal.

Further, the multi-channel data acquisition unit includes eight input channels, adopting a differential input mode, each channel receiving different types of sensor input signals and performing acquisition and conversion.

Further, a micro-control processor performs data filtering on monitoring data acquired by the multi-channel data acquisition unit to eliminate invalid junk data, performs data conversion, and automatically compares the acquired monitoring data with the threshold value set in the high and low frequency remote data wireless transmission module.

Further, the Hamming code detects errors occurring during transmission by adding redundant data, corrects the errors according to the redundant data, and increases an effective distance of data transmission by correcting the errors during transmission.

Further, the parity check code helps to verify the integrity of the data by adding parity check bits to the data, and discover and correct the errors during transmission in time to reduce an error rate of data transmission.

Further, when the high and low frequency remote data wireless transmission module transmits in a high frequency mode and after an occurrence time of a last high frequency event is greater than 5 s, all data are less than the threshold value, and the high and low frequency remote data wireless transmission module automatically switches to a low frequency mode for transmission.

Further, the server unit processes all the monitoring data in real time, calculates a weight of data evaluation indexes to obtain a data monitoring result, and performs visual display by an electronic map to realize early warning.

Further, the server unit may introduce meteorological data, display meteorological information of an area on the electronic map, and provide short-duration rainfall and early warning information for business managers.

Further, the feedback monitoring unit centrally displays service statuses of the ocean engineering structures, and integrates monitoring data of multiple ocean engineering in the area, realizing centralized monitoring and early warning of multiple ocean engineering structures according to visualization and early warning results of the server unit, and simultaneously providing support for interactive feedback between the ocean engineering.

The present disclosure has the following advantageous effects. Compared with the prior art, the present disclosure provides an active-type multi-level wireless networking transmission system under high and low frequency stresses for ocean engineering structures, including sensor units, a multi-channel data acquisition unit, a micro-control processor unit, a data wireless transmission unit, a server unit and a feedback monitoring unit. The sensor unit can accurately monitor dynamic responses of ocean engineering structures and convert mechanical vibrations into electrical outputs; the multi-channel data acquisition unit, connected to multiple sensors for monitoring vibration responses of different parts of the ocean engineering structures; the micro-control processor unit realizes the preprocessing of monitoring data and data storage, and is connected to the data wireless transmission unit via serial port communication; the data wireless transmission unit sends the acquired monitoring data to a remote server in real time for data processing, stores the data and performs visual analysis of monitoring results, a data transmission threshold value is set in a high and low frequency remote data wireless transmission module, and when the monitoring data exceeds the threshold value, it is automatically converted to high-frequency transmission, and a high-frequency transmission time is set; the server unit is configured to receive the acquired monitoring data in real time, and realize data visualization analysis and early warning analysis; and the feedback monitoring unit is configured to realize feedback monitoring and threshold value correction for multiple sensing systems. Through the accurate monitoring of the sensor units, dynamic responses of the ocean engineering structures can be captured in time to realize the accurate perception of the vibrations. The multi-channel data acquisition unit is connected to multiple sensors to realize the vibration response monitoring of different parts of the ocean engineering structures, and comprehensively understand the dynamic condition of structures. The micro-control processor unit is responsible for monitoring the preprocessing and storage of data to ensure the integrity and reliability of data. The data wireless transmission unit realizes real-time transmission of data to the remote server, and realizes data processing, storage and visual analysis; and builds in a data sending threshold value and a high frequency transmission mechanism, can timely respond to abnormal conditions, and can take corresponding measures. The server unit receives and analyzes the data in real time, and the feedback monitoring unit can realize monitoring and threshold value correction for multiple sensing systems, further improving the stability and accuracy of the systems.

BRIEF DESCRIPTION OF THE DRAWINGS

FIG. 1 is a schematic diagram of an active-type multi-level wireless networking transmission system under high and low frequency stresses for ocean engineering structures according to the present disclosure.

DETAILED DESCRIPTION

The present disclosure is further described in detail with the attached drawings and specific implementations.

As shown in FIG. 1, an active-type multi-level wireless networking transmission system under high and low frequency stresses for ocean engineering structures provided by the present disclosure includes sensor units, a multi-channel data acquisition unit, a micro-control processor unit, a data wireless transmission unit, a server unit and a feedback monitoring unit.

The sensor unit can accurately monitor vibration responses of ocean engineering structures, and monitor the deformation and displacement of piers and towers by arranging multiple sensors at key positions of the ocean engineering structures, such as piers and towers of cross-sea bridges, to ensure the stability and structural safety. There is also a main structure of a bridge beam of the cross-sea bridge, including main load-bearing structures such as a bridge floor and a main beam, and its deformation, stress and vibration are monitored. The sensor unit is connected to the multi-channel data acquisition unit, and is configured to monitor abnormal vibration response data of different parts of the ocean engineering structures, and convert mechanical energy of vibration responses into electrical signals. When the structure vibrates, a sensor material is subject to force change to generate an electric charge distribution change based on a piezoelectric effect, generating an electric signal.

The multi-channel data acquisition unit is a chip integrated with multiple data acquisition functions and multi-sensor data acquisition, and can simultaneously acquire multiple different types of signals or data and convert the same. A multi-channel data acquisition unit chip includes eight input channels, and simultaneously acquires eight signals. A differential input mode is adopted; and each channel can receive different types of input signals and perform high-speed and accurate acquisition and conversion. The multi-channel data acquisition unit can simultaneously acquire monitoring signals of eight sensors and is highly integrated, which greatly reduces the complexity of the system and the number of external components, can acquire and convert signals with high sampling rate and low sampling error, and ensures the accuracy and reliability of data.

The micro-control processor unit is a control core of the monitoring system, realizes the preprocessing of monitoring data and data storage, and is connected to the data wireless transmission unit via serial port communication. A micro-control processor performs data filtering on the data acquired by the multi-channel data acquisition unit to eliminate invalid junk data; and performs data conversion, builds a monitoring threshold value therein, and automatically compares the acquired monitoring data with the threshold value. The micro-control processor is configured to control and process the data, which is versatile and can perform a variety of tasks, including data conversion, logical operations, control algorithms, etc. The micro-control processor is integrated in an embedded system for controlling the operation of the device and responding to external events. Combined with the multi-channel data acquisition unit, the complete data acquisition and processing functions are realized.

The data wireless transmission unit sends the acquired monitoring data to a remote server in real time for data processing, stores the data and performs visual analysis of the monitoring results. An interior of the data wireless transmission unit contains a high and low frequency remote data wireless transmission module, and specifically adopts a new method of encoding and decoding algorithm, so that the submarine data transmission is faster and more stable, and at the same time, a longer-distance transmission can be realized. The encoding and decoding algorithm specifically includes Hamming codes and parity check codes, and the two codes are used in combination. The Hamming code can detect errors occurring during transmission by adding redundant data, and can correct the errors according to the redundant data. Therefore, it is also possible to increase an effective distance of data transmission by correcting the errors during transmission. In submarine data transmission, the influence of sea water may lead to signal distortion and error occurrence; and due to the complexity and fluctuation of underwater acoustic propagation, data transmission may be greatly disturbed. For the above conditions, the Hamming code can effectively help to detect and correct these errors, and improve the reliability, stability and effective distance of data transmission. The parity check code can help to verify the integrity of data, and find and correct errors in transmission in real time by adding parity check bits to the data, thereby reducing an error rate of data transmission. In summary, the hamming code can detect and correct errors occurring during transmission by adding redundant data, while the parity check code can help to quickly detect the errors. The combined use of these two coding methods can improve the detection and correction ability of the errors during transmission, and ensure the reliability of data transmission.

The high and low frequency remote data wireless transmission module also has a data transmission threshold value; and the high-frequency signal has a limited propagation distance in the water and is easily interfered by water flow and other factors, so it is suitable for short-range communication. Low-frequency signals have better long-distance transmission performance, but a transmission rate is lower. In the monitoring of a large cross-sea bridge, a signal strength threshold value of a receiving end is set to −60 dBm, a dynamic adjustment threshold value range is −70 dBm to −50 dBm, and a data transmission rate is set to 1000 bps. For the situation of high demand for real-time monitoring, it can be increased to 2000 bps. In a clear water area, the signal attenuation is smaller, about 0.2 dB/m; and in a turbid water area, the signal attenuation is lager, about 0.5 dB/m. When the acquired data is less than the threshold value, the monitoring system is in a sleep mode, operating in a low frequency mode of 1 hz and transmitting in a low frequency mode, which can significantly reduce the power consumption. When the acquired data is greater than the threshold value, the data wireless transmission unit is activated to the early warning mode, triggering a frequency of 55 hz for data transmission. The data wireless transmission unit may also set a high frequency triggering time, for example, a triggering time is set as 5 s. After an occurrence time of a last high frequency event is greater than 5 s, all data are less than the threshold value at this time, the data wireless transmission unit will automatically switch to the sleep mode. The data wireless transmission unit can realize the remote wireless transmission of more than 10 km, which provides a guarantee for the real-time wireless monitoring of the ocean engineering structures.

The server unit receives and processes all the monitoring data in real time, is configured to determine a difference or deviation degree between a current state and an expected state of the server unit through some parameters or numerical values set based on the requirements of system performance, stability and security, etc., and performs comparison and evaluation pre-warning by monitoring various indexes or performance parameters of the server unit, to realize a threshold value determination process. The evaluation pre-warning refers to calculating the weight of data evaluation indexes to obtain a data monitoring result, and performing visual display. The visualization refers to displaying the obtained evaluation results, centrally displaying key data such as ocean engineering video pictures and monitoring equipment status by means of an electronic map, and viewing the monitoring results in real time. At the same time, the meteorological data is introduced to display meteorological information of an area on the electronic map in the way of identification, to provide short-duration rainfall and early warning information for business managers.

The feedback monitoring unit centrally displays service statuses of the ocean engineering structures, and integrates monitoring data of multiple ocean engineering in an area, realizing centralized monitoring, early warning and threshold value correction of multiple ocean engineering structures, and simultaneously providing support for interactive feedback between the ocean engineering.

The invention claimed is:

1. An active-type multi-level wireless networking transmission system under high and low frequency stresses for ocean engineering structures, comprising:

multiple sensor units, a multi-channel data acquisition unit, a micro-control processor unit, a data wireless transmission unit, a server unit and a feedback monitoring unit, wherein the multiple sensor units are configured to monitor vibration responses of the ocean engineering structures and convert mechanical vibrations into electrical signals for an output signal;

the multi-channel data acquisition unit, connected to the multiple sensor units, is configured to acquire the output signal of an acquired monitoring data of the multiple sensor units, convert the output signal into a digital signal, and transmit the digital signal to the micro-control processor unit;

the micro-control processor unit is configured for preprocessing the acquired monitoring data and a data storage, and is connected to the data wireless transmission unit via serial port communication;

the data wireless transmission unit is configured to send the preprocessed acquired monitoring data by the micro-control processor unit to the server unit in real time;

the data wireless transmission unit contains a high and low frequency remote data wireless transmission module, adopting an encoding and decoding algorithm combining Hamming codes and parity check codes to transmit the preprocessed acquired monitoring data, and setting a high and low frequency conversion threshold value;

in a low frequency operation mode of 1 hertz (Hz), the preprocessed acquired monitoring data, when less than the high and low frequency conversion threshold value, is transmitted to the server unit in a low frequency range; and the preprocessed acquired monitoring data, when greater than the high and low frequency conversion threshold value, is transmitted to the server unit in a high frequency range, triggering a high frequency operation mode of 55 hertz (Hz) for data transmission;

the server unit is configured to receive the preprocessed acquired monitoring data in the real time, perform data processing, storage, and visual analysis on monitoring results of the preprocessed acquired monitoring data and perform early warning in the ocean engineering structures; and the feedback monitoring unit is configured to realize feedback monitoring and threshold value correction for multiple sensing systems of the active-type multi-level wireless networking transmission system.

2. The active-type multi-level wireless networking transmission system under the high and low frequency stresses for the ocean engineering structures according to claim 1, wherein the multiple sensor units are placed at key positions of the ocean engineering structures to monitor abnormal vibration response data of the structures; and when the structures vibrate, a sensor material is subject to force change to generate an electric charge distribution change based on a piezoelectric effect, generating an electric signal.

3. The active-type multi-level wireless networking transmission system under the high and low frequency stresses for the ocean engineering structures according to claim 1, wherein the multi-channel data acquisition unit comprises eight input channels, adopting a differential input mode, each input channel of the eight input channels receiving different types of sensor input signals and performing acquisition and conversion.

4. The active-type multi-level wireless networking transmission system under the high and low frequency stresses for the ocean engineering structures according to claim 1, wherein the micro-control processor unit performs data filtering on the preprocessed acquired monitoring data acquired by the multi-channel data acquisition unit to eliminate invalid junk data, performs data conversion, and automatically compares the preprocessed acquired monitoring data with the high and low frequency conversion threshold value set in the high and low frequency remote data wireless transmission module.

5. The active-type multi-level wireless networking transmission system under the high and low frequency stresses for the ocean engineering structures according to claim 1, wherein the Hamming codes detect errors occurring during the data transmission by adding redundant data, correct the errors according to the redundant data, and increase an effective distance of the data transmission by correcting the errors during the data transmission.

6. The active-type multi-level wireless networking transmission system under the high and low frequency stresses for the ocean engineering structures according to claim 1, wherein the parity check codes help to verify an integrity of the preprocessed acquired monitoring data by adding parity check bits to the preprocessed acquired monitoring data, and discover and correct errors during the data transmission in the real time to reduce an error rate of the data transmission.

7. The active-type multi-level wireless networking transmission system under the high and low frequency stresses for the ocean engineering structures according to claim 1, wherein when the high and low frequency remote data wireless transmission module transmits in the high frequency operation mode and after an occurrence time of a last high frequency event is greater than 5 seconds, the preprocessed acquired monitoring data are less than the high and low frequency conversion threshold value, and the high and low frequency remote data wireless transmission module automatically switches to the low frequency operation mode for the data transmission.

8. The active-type multi-level wireless networking transmission system under the high and low frequency stresses for the ocean engineering structures according to claim 1, wherein the server unit processes the preprocessed acquired monitoring data in the real time, calculates a weight of data evaluation indexes to obtain a data monitoring result of the preprocessed acquired monitoring data, and performs visual display by an electronic map to realize the early warning in the ocean engineering structures.

9. The active-type multi-level wireless networking transmission system under the high and low frequency stresses for the ocean engineering structures according to claim 1, wherein the server unit may introduce meteorological data, display meteorological information of an area on an electronic map, and provide short-duration rainfall and early warning information for business managers.

10. The active-type multi-level wireless networking transmission system under the high and low frequency stresses for the ocean engineering structures according to claim 1, wherein the feedback monitoring unit centrally displays service statuses of the ocean engineering structures, and integrates the preprocessed acquired monitoring data of the ocean engineering structures in an area, realizing centralized monitoring and the early warning in the ocean engineering structures according to visualization and early warning results of the server unit, and simultaneously providing support for interactive feedback between the ocean engineering structures.

\* \* \* \* \*